United States Patent
Ouchida et al.

(10) Patent No.: US 6,822,158 B2
(45) Date of Patent: Nov. 23, 2004

(54) THIN-FILM SOLAR CELL AND MANUFACTURE METHOD THEREFOR

(75) Inventors: Takashi Ouchida, Kitakatsuragi-gun (JP); Hitoshi Sannomiya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/372,139

(22) Filed: Feb. 25, 2003

(65) Prior Publication Data

US 2003/0168096 A1 Sep. 11, 2003

(30) Foreign Application Priority Data

Mar. 11, 2002 (JP) .................................... 2002-065585
Jan. 8, 2003 (JP) .................................... 2003-002160

(51) Int. Cl.$^7$ ........................ H01L 31/04; H01L 31/18
(52) U.S. Cl. .................. 136/256; 136/262; 136/265; 438/98; 438/69; 438/72; 204/192.17; 204/192.29; 204/298.19; 204/298.23
(58) Field of Search .................... 136/256, 262, 136/265; 438/98, 69, 72; 204/192.17, 192.29, 298.19, 298.23

(56) References Cited

U.S. PATENT DOCUMENTS 4,623,601 A * 11/1986 Lewis et al. .................. 430/69
6,265,652 B1 * 7/2001 Kurata et al. ................ 136/244

FOREIGN PATENT DOCUMENTS

| JP | 61-210681 A | | 9/1986 |
|----|-------------|---|--------|
| JP | 3-129608 A | * | 6/1991 |
| JP | 6-338623 A | | 12/1994 |
| JP | 10-158833 A | | 6/1998 |
| JP | 11-284211 A | * | 10/1999 |
| JP | 2001-32068 A | | 2/2001 |

OTHER PUBLICATIONS

Rech et al, "Texture etched ZnO:Al films as front contact and back contact reflector in amorphous silicon p–i–n and n–i–p solar cells," 26th PVSC, Sep. 30 to Oct. 3, 1997, pp. 619–622.*

* cited by examiner

*Primary Examiner*—Alan Diamond
(74) *Attorney, Agent, or Firm*—Nixon & Vanderhye P.C.

(57) ABSTRACT

A thin-film solar cell including a transparent electrode layer, a semiconductor photovoltaic conversion layer, a rear transparent electrode layer and a rear reflective metal layer, said layers being formed in this order on a transparent substrate, wherein the rear transparent electrode has a two-layer structure of an ITO or ZnO:Ga layer and a ZnO:Al layer formed in this order on the semiconductor photovoltaic conversion layer.

17 Claims, 1 Drawing Sheet

THIN-FILM SOLAR CELL AND MANUFACTURE METHOD THEREFOR

CROSS-REFERENCES TO RELATED APPLICATIONS

This application is related to Japanese Patent Applications Nos. 2002-65585 filed on Mar. 11, 2002 and No. 2003-2160, filed on Jan. 8, 2003 whose priorities are claimed under 35 USC § 119, the disclosures of which are incorporated by reference in their entirety.

BACKGROUND OF THE INVENTION

1. Field of the Invention

The present invention relates to a thin-film solar cell and a manufacture method therefor, more particularly to a thin-film solar cell having a transparent electrode layer that allows improvement of performance of the thin-film solar cell including, for example, photovoltaic conversion efficiency, and a manufacture method therefor.

2. Description of Related Art

Solar cells are photovoltaic conversion devices which convert solar light into electric energy and are expected to provide clean energy alternative to nuclear energy and fossil energy such as petroleum. One of the most important challenges for putting solar cells into practical use is to reduce production costs.

The solar cells are roughly classified according to their materials into those using monocrystalline materials, those using polycrystalline materials, those using amorphous materials and those using thin films of compounds. Among them, those using amorphous materials and thin films of compounds are under active development because their materials are expected to allow the production costs to reduce greatly.

The production costs of solar cells should be calculated per unit electric power they produce, and it is considered that the production costs may be reduced by technological development concerning upsizing, high-speed and high-power operation of solar cells, etc.

As means for high-power operation, there is known a technique of forming a reflective film of a metal such as Al, Cu, Au or the like having a high reflectivity on a rear side, a side opposite to a light-incident side of a solar cell. This technique is intended to reflect light traveling through a semiconductor layer of a solar cell, which produces carriers, by the reflective layer to make the light absorbed again in the semiconductor layer, thereby increasing output current and improving photovoltaic conversion efficiency.

However, if a film of a reflective metal is used as a rear electrode, the metal itself diffuses into the semiconductor layer to deteriorate characteristics of the solar cell or to establish conduction with an electrode on the light-incident side and cause a shunt. That is marked particularly in the case where the rear electrode is formed to have a rough face for scattering light traveling through the semiconductor layer to increase the optical path of long wavelength light which has a small absorption coefficient.

On the other hand, a method is known which is intended to improve surface characteristics of the substrate, i.e., the flatness of the rear electrode and the adhesion of the semiconductor layer, or to prevent the metal of the rear electrode from forming an alloy with the semiconductor layer by intervention of a transparent electrode layer between the rear electrode and the semiconductor layer. It is also proposed that the method increases the sensitivity of the solar cell to spectra in a long wavelength region and reduces current running in defect regions of the semiconductor layer.

Thus the transparent electrode layer on the rear side of the thin-film solar cell has a significant role in improvement of the conversion efficiency. Typically, ZnO:Al is used in view of costs and stability of films formed thereof.

For forming the transparent electrode layer as a thin film with a large area, a magnetron sputtering apparatus is used, for example. Magnetron sputtering apparatus generally include (1) those of a magnet-fixed substrate-fixed type, (2) those of a magnet-moving substrate-fixed type and (3) those of a magnet-fixed substrate-moving type.

However, if (1) a magnetron sputtering apparatus of the magnet-fixed substrate-fixed type is used for forming a thin film on a fixed substrate with a large area, a large number of magnets are required to be mounted to cover a large film-formation region. Thus the apparatus becomes complicated and the production costs rise. Even if magnets are used in a great number, it is difficult to form a uniform magnetic field over the large film-formation region owing to non-uniform consumption of a target and other causes. Thus the film formed by deposition is still non-uniform.

In the case of (2) a magnetron sputtering apparatus of the magnet-moving substrate-fixed type, usually, a magnet moved reciprocally over the film-formation region many times. As compared with the apparatus (1), the film deposited on the substrate is more homogeneous and the target is used more efficiently. For example, Japanese Unexamined Patent Publication HEI 10(1998)-158833 describes that a magnet is moved reciprocally eleven times for forming an ITO (indium.tin oxide) film of 60 nm thickness. Japanese Unexamined Patent Publication 2001-32068 describes that a magnet is moved reciprocally two or more times for forming a single thin film of a metal oxide.

Yet neither the apparatus (1) nor (2) provides a sufficient fill factor as an output characteristic of solar cells owing to unsatisfactory quality of the obtained film as the rear transparent electrode layer and unsatisfactory junction state between the photovoltaic conversion layer and the transparent electrode layer. Further improvement in the photovoltaic conversion efficiency and reduction in the production costs are demanded.

Japanese Unexamined Patent Publication HEI 6(1994)-338623 discloses use of Ga-doped ZnO films for the rear transparent electrode layer instead of conventional Al-doped ZnO films.

However, a single film of Ga-doped ZnO does not contribute to reduction in the production costs. The change of a target with time prevents obtainment of stable film quality and declines the fill factor.

SUMMARY OF THE INVENTION

The present invention provides a thin-film solar cell comprising a transparent electrode layer; a semiconductor photovoltaic conversion layer; a rear transparent electrode layer; and a rear reflective metal layer, said layers being formed in this order on a transparent substrate, wherein the rear transparent electrode has a two-layer structure of an ITO or ZnO:Ga layer and a ZnO:Al layer formed in this order on the semiconductor photovoltaic conversion layer.

The present invention also provides a method for manufacturing a thin-film solar cell comprising forming a transparent electrode layer, a semiconductor photovoltaic conversion layer, a rear transparent electrode layer and a rear reflective metal layer in this order on a transparent substrate, wherein the rear transparent electrode layer is formed in a two-layer structure of an ITO or ZnO:Ga layer and a ZnO:Al layer which are continuously formed using a magnetron sputtering apparatus of a substrate-moving type having an ITO or ZnO:Ga target and a ZnO:Al target arranged in this order in a substrate-moving direction.

Thus, an object of the present invention is to provide a thin-film solar cell with a rear transparent electrode layer which can be manufactured by a high throughput production and exhibits a stable film quality and a good ohmic contact, thereby improving the output characteristic and further the photovoltaic conversion efficiency even of a thin-film solar cell with a large area. The invention also provides a manufacture method for the cell.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
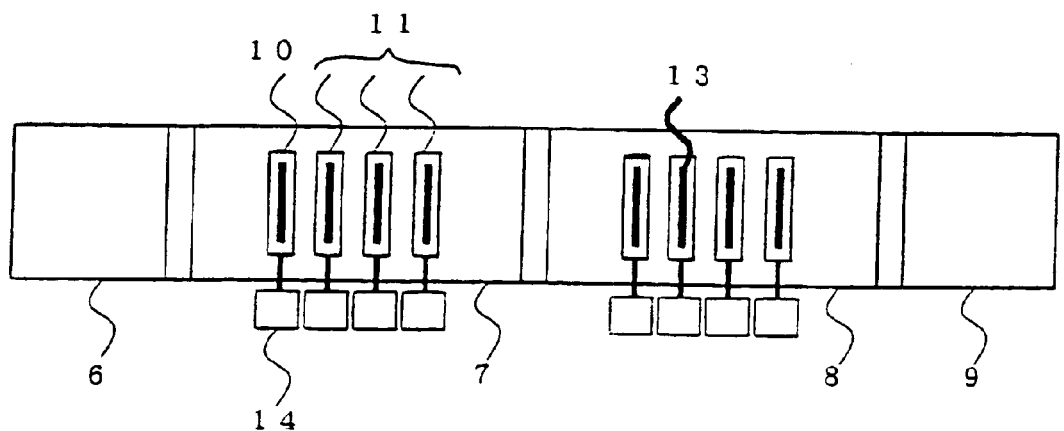
FIG. 1 is a schematic view showing an example of a magnetron sputtering apparatus of a substrate-moving type.

The inventors of the invention have earnestly studied materials for the rear transparent electrode layer, its film quality and its manufacture method, to find that the use of ITO or ZnO:Ga for the rear transparent electrode layer of the thin-film solar cell is suitable for improving the stability of the film quality of the rear transparent electrode layer (a layer in contact with the semiconductor photovoltaic conversion layer) and the output characteristic of the solar cell. ITO has a higher carrier density and a lower specific resistance than ZnO:Al which has been usually used.

The inventors have also found the following. In the case where a magnet sputtering apparatus is used for forming the rear transparent electrode layer, a film formed at an initial stage of discharge cannot have a good ohmic contact with the photovoltaic conversion layer and a sufficient fill factor cannot be obtained, owing to a trace of residual oxygen adsorbed on the surface of a target and/or powdery contaminants containing metal and adhering to the surface of the target. Thus the characteristics of the thin-film solar cell decline. In addition to that, in the case where the rear transparent electrode layer is formed when the vacuum degree is poor before its formation, the contact with the photovoltaic conversion layer tends to worsen remarkably. The target undergoes a change with time, that is, the target gradually accumulates powdery contaminants containing metal, and this change with time becomes more significant as discharge is maintained for a long time.

The thin-film solar cell of the present invention is composed mainly of a transparent electrode layer, a semiconductor photovoltaic conversion layer, a rear transparent electrode layer and a rear reflective-metal layer which are formed in this order on a transparent substrate.

As the transparent substrate of the thin-film solar cell, any one that supports and reinforces the whole thin-film solar cell and has thermal resistance may be mentioned without any particular limitation. For example, usable are substrates of glass; thermally resistant polymer films such as polyimide, PET, PEN, PES, Teflon®, etc.; stainless steel (SUS) and the like. The transparent substrate suitably has such a thickness that confers appropriate strength and weight to the substrate, for example, about 0.1 to 30 nm. The substrate may have depressions and projections on its surface.

The photovoltaic conversion layer usually includes a pin junction which is constructed of layers optionally monocrystalline, polycrystalline, microcrystalline or amorphous. The pin junction is not necessarily single junction, but may be multijunction. The photovoltaic conversion layer can be formed by a known method.

The rear transparent electrode layer has a two-layer structure of an ITO or ZnO:Ga layer and a ZnO:Al layer formed in this order on the semiconductor photovoltaic conversion layer. The ITO layer is a layer formed mainly of $In_2O_3$ preferably containing about 2 to 15 wt % of tin. The ZnO:Ga layer is a layer formed mainly of ZnO preferably containing about 2 to 7 wt % of Ga. The thickness of the ITO or ZnO:Ga layer is preferably about 5 to 30 nm from the viewpoint of required good contact with the semiconductor photovoltaic layer as well as reduction in the production costs.

The ZnO:Al layer is a layer formed mainly of ZnO suitably containing about 1 to 5 wt % of Al. The thickness of the ZnO:Al layer is suitably about 50 to 100 nm.

As the rear reflective metal layer, any one that can be used as a reflective film in the field of solar cells may be mentioned without any particular limitation. For example, metals such as gold, silver, copper, aluminum and the like are usable. The thickness thereof is about 200 to 500 nm, for example.

According to the method for manufacturing the thin-film solar cell of the present invention, a substrate-moving-type magnetron sputtering apparatus is preferably used. More preferably, the apparatus is of in-line system. In this apparatus, an ITO or ZnO:Ga target and an ZnO:Al target are required to be disposed in this order in a substrate-moving direction.

Preferably the ITO or ZnO:Ga target are not liable to a change with time such that particulate contaminants gradually accumulate on the surface of the target. For this, the ITO or ZnO:Ga target preferably has a high relative density. For example, the ITO target may has a relative density of about 95% or more and the ZnO:Ga target may has a relative density of about 92% or more, preferably 95% or more. The tin or Ga content in the ITO or ZnO:Ga target is preferably such a degree that sufficient electro-conductivity and light-transmissivity can be obtained. For example, the tin content in the ITO target is preferably about 2 to 15 wt % with respect to the ITO target, and the Ga content in the ZnO:Ga target is preferably about 2 to 7 wt % with respect to the ZnO:Ga target.

The ZnO:Al target can be adjusted to proper relative density and Al content in view of the stabilizing of the layer and the production costs. Preferably, the ZnO:Al target has a relative density of about 80% or more, about 90% or more, about 95% or more, for example, and the Al content in the ZnO:Al target is preferably about 1 to 5 wt % with respect to the ZnO:Al target.

These targets can be adjusted in size, number and the like as appropriate depending upon an apparatus to be used, the thickness of the electrode to be formed, the size of the solar cell to be formed and used, and the like. For example, the targets may have an area of about 100 to 10,000 $cm^2$. The targets do not necessarily have the same size. The number of ITO or ZnO:Ga targets is preferably smaller than that of ZnO:Al targets. Preferably the number of ITO or ZnO:Ga targets is about one to three and the number of ZnO:Al targets is about two to seven. The targets need to be so arranged that the substrate, introduced in a film-formation chamber of the apparatus, passes over the ITO or ZnO:Ga targets and then passes over the ZnO:Al targets. Thereby, the ITO or ZnO:Ga layer and the ZnO:Al layer can be sequentially formed only by passing the substrate through the film-formation chamber. Usually, for forming an ITO film, oxygen is introduced in a film-formation chamber for rendering the ITO film low in resistance. However, according to the present invention, the ITO target and the ZnO:Al target are placed in the same chamber, and thus the control of the amount of oxygen is particularly difficult, so that oxygen may have adverse effect as contamination. Therefore, it is preferred that oxygen is not introduced and only Ar is introduced.

Before the above layers are formed, the substrate is suitably heated. The temperature of the heated substrate is not particularly limited, but temperatures from about 120 to 180° C. may be suitable. The film-formation chamber is preferably in a vacuum state. The vacuum state may preferably be such that the pressure is about $5 \times 10^{-3}$ Pa or lower.

The sputtering method to be used may be either an RF sputtering method or a DC sputtering method. For example, it is preferable that the ITO or ZnO:Ga layer is deposited by the RF sputtering method and the ZnO:Al layer is deposited by the DC sputtering method. Conditions for the sputtering methods are not particularly limited. For example, the power can be adjusted as appropriate depending upon the type, thickness, location and the like of the targets. Particularly, a discharge density of about 0.5 to 5 W/cm$^2$, preferably about 1 to 3 W/cm$^2$, may be mentioned. More particularly, the ITO or ZnO:Ga layer is suitably deposited at a lower power than that at which the ZnO:Al layer is deposited, and may preferably be deposited at 0.5 to 2 W/cm$^2$.

The magnetic field intensity of the ITO or ZnO:Ga target is set larger than that of the ZnO:Al target. Particularly, the magnetic field intensity of the ITO or ZnO:Ga target may be about 500 G or more, preferably about 900 G to 1500 G, and the magnetic field intensity of the ZnO:Al target may be about 200 to 800 G.

The thin-film solar cell of the invention and its manufacture method are now described in further detail by way of examine with reference to the attached drawings.

Figure 2:
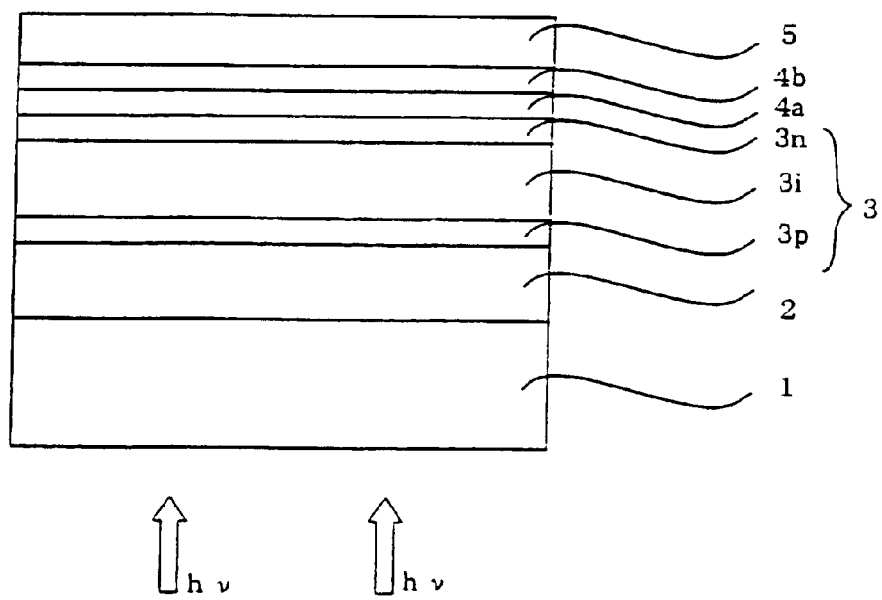
FIG. 2 is a schematic sectional view of a thin-film solar cell in accordance with an example of the present invention.

According to the invention, as shown in FIG. 2, a thin-film solar cell is composed as an integrated amorphous thin-film solar cell of a SnO$_2$ layer 2, a semiconductor photovoltaic conversion layer 3 including a p-layer 3p, an i-layer 3i and an n-layer 3n, a rear transparent electrode layer 4 including an ITO layer or a ZnO:Ga layer 4a and ZnO:Al layer 4b and Ag layer 5 which are formed on a glass substrate 1 in this order from a light-incident side.

This thin-film solar cell can be manufactured using a substrate-moving-type magnetron sputtering apparatus as shown in FIG. 1, as described below.

First, the glass substrate 1 was prepared which had the SnO$_2$ layer 2 as a transparent conductive layer formed on a main surface thereof. Such a glass substrate provided with a SnO$_2$ layer was commercially available. The glass substrate 1 had an area of about 650 mm×910 mm.

The semiconductor photovoltaic conversion layer 3 was formed as a known integrated one on the SnO$_2$ layer 2 using a known plasma CVD method and laser scribe method according to a conventional method, for example, as disclosed in Japanese Unexamined Patent Publication No. SHO 61(1986)-210681.

The resulting glass substrate 1 with the SnO$_2$ layer 2 and the semiconductor photovoltaic conversion layer 3 laminated thereon was placed on a substrate holder (not shown) of the substrate-moving-type magnetron sputtering apparatus shown in FIG. 1. The apparatus was a sputtering apparatus of in-line system having four chambers, i.e., a preparation chamber 6, an ITO and ZnO deposit chamber 7, a Ag deposit chamber 8 and an outlet chamber 9, each connected to a vacuum pump (not shown). The apparatus was also provided with a substrate loading/unloading section (not shown) and a substrate transfer section (not shown) upstream and downstream thereof. ITO and ZnO targets of 254 mm (width)×990 mm (length)×6 mm (thickness), four in total, were placed at intervals of 36 cm along one side of the ITO and ZnO deposit chamber 7. One ITO target or One ZnO:Ga 10 and three ZnO:Al targets 11 were arranged from a preparation chamber 6 side. Each of the targets was connected to a DC power source 14 or an RF power source. Here the targets were placed along one side of the chamber, but the targets may be placed along both sides of the chamber to allow the apparatus to deposit films at a time on both faces. In the latter case, the power source is connected to opposed targets in parallel. A magnet 13 was disposed behind the target with intervention of a backing plate. The magnet 13 may be fixed, but may preferably be movable in order that the target can be consumed in an in-plan uniform manner to lengthen the life of the target.

The glass substrate 1 was first introduced into the preparation chamber 6 and was heated and the inside of the chamber was vacuumed. Then the substrate 1 was moved into the ITO and ZnO deposit chamber 7 and was passed over the four targets caused to discharge by the DC power source 14 so that the ITO layer or ZnO:Ga 4a and the ZnO:Al layer 4b were sequentially deposited on the semiconductor photovoltaic conversion layer 3 to form the rear transparent electrode layer 4 of 100 nm thickness.

Some examples of particular conditions for depositing the rear transparent electrode layer 4 were as follows. As Production Example 1, the substrate 1 was heated to 150° C. in the preparation chamber 6, which was vacuumed to $8 \times 10^{-3}$ Pa. Before film deposition in the ITO and ZnO deposit chamber 7, the back pressure was set to $3 \times 10^{-3}$ Pa. In the ITO and ZnO deposit chamber 7, used was an ITO target produced by cold pressing which had a relative density of 92% and a tin content of 5 wt % or an ZnO:Ga target produced by cold pressing which had a relative density of 92% and a Ga content of 5 wt %. In a state of a cumulative discharge power energy of 100 kWh, ITO or ZnO:Ga and ZnO:Al were deposited to 25 nm and 75 nm thickness, respectively. The magnetic field intensity was 1,000 G on the surfaces of all the targets, and the discharge power was DC 2.5 W/cm$^2$ for all the targets.

As Production Example 2, the glass substrate 1 was heated in the preparation chamber 6, which was vacuumed, in the same manner as in Production Example 1. In the ITO and ZnO deposit chamber 7, used was an ITO target produced by hot pressing which had a relative density of 98% and a tin content of 5 wt % or a ZnO:Ga target produced by hot pressing which had a relative density of 98% and a Ga content of 5 wt %. In a state of a cumulative discharge power energy of 100 kWh, ITO or ZnO:Ga and ZnO:Al were deposited to 25 nm and 75 nm thickness, respectively. The magnetic field intensity was 1,000 G on the surfaces of all the targets, and the discharge power was DC 2.5 W/cm$^2$ for all the targets.

As Production Example 3, the glass substrate 1 was heated in the preparation chamber 6, which was vacuumed, in the same manner as in Production Example 1. In the ITO and ZnO deposit chamber 7, used was an ITO target produced by hot pressing which had a relative density of 98% and a tin content of 5 wt % or a ZnO:Ga target produced by hot pressing which had a relative density of 98% and a Ga content of 5 wt %. In a state of a cumulative discharge power energy of 100 kWh, ITO or ZnO:Ga and ZnO:Al were deposited to 25 nm and 75 nm thickness, respectively. The magnetic field intensity was 1,000 G on the surface of the ITO or ZnO:Ga target and was 500 G on the surfaces of the ZnO:Al targets, and the discharge power was DC 2.5 W/cm$^2$ for all the targets.

As Production Example 4, the glass substrate 1 was heated in the preparation chamber 6, which was vacuumed, in the same manner as in Production Example 1. In the ITO and ZnO deposit chamber 7, used was an ITO target produced by hot pressing which had a relative density of 98% and a tin content of 5 wt % or an ZnO:Ga target produced by hot pressing which had a relative density of 98% and a Ga content of 5 wt %. In a state of a cumulative discharge power energy of 100 kWh, ITO or ZnO:Ga and ZnO:Al were deposited to 10 nm and 75 nm thickness, respectively. The magnetic field intensity was 1,000 G on the surfaces of all the targets, and the discharge power was FR 1.0 W/cm$^2$ for ITO or ZnO:Ga and DC 2.5 W/cm$^2$ for ZnO:Al.

As Production Example 5, the substrate 1 was heated to 150° C. in the preparation chamber 6, which was vacuumed to 3×10$^{-2}$ Pa. Before film deposition in the ITO and ZnO deposit chamber 7, the back pressure was 8×10$^{-3}$ Pa. In the ITO and ZnO deposit chamber 7, used was an ITO target produced by hot pressing which had a relative density of 98% and a tin content of 5 wt % or a ZnO:Ga target produced by hot pressing which had a relative density of 98% and a Ga content of 5 wt %. In a state of a cumulative discharge power enerugy of 100 kWh, ITO or ZnO:Ga and ZnO:Al were deposited to 25 nm and 75 nm thickness, respectively. The magnetic field intensity was 1,000 G on the surface of the ITO or ZnO:Ga targets and was 500 G on the surfaces of the ZnO:Al target, and the discharge power was DC 2.5 W/cm$^2$ for all the targets.

As Comparative Example, the glass substrate 1 was heated in the preparation chamber 6, which was vacuumed, in the same manner as in Production Example 1. In the ITO and ZnO deposit chamber 7, all the targets were ZnO:Al targets, and in a state of a cumulative discharge power enerugy of 100 kWh, ZnO:Al was deposited to 100 nm thickness. The magnetic field intensity was 1,000 G on the surfaces of all the targets, and the discharge power was DC 2.5 W/cm$^2$ for all the targets.

The substrates 1 obtained in the above examples were each moved into the Ag deposit chamber 8 and passed over Ag targets so that the Ag layer 5 was deposited to 300 nm thickness subsequently on the rear transparent electrode layer 4.

Lastly, the Ag layer 5 and the rear transparent electrode layer 4 were laser-scribed in a desired pattern. Thus integrated amorphous thin-film solar cells were produced.

The solar cells produced by the above-described method were then evaluated on their cell characteristics. The results are shown in Table 1. In Table 1, the evaluation results of Comparative Example are normalized to 1, and the other results are represented with respect thereto.

TABLE 1

| Exs | | Short-circuit Current | Open-Circuit Voltage | Fill Factor | Conversion Efficiency |
|---|---|---|---|---|---|
| 1 | ITO | 1 | 1 | 1.03 | 1.03 |
|  | ZnO:Ga | 1 | 1 | 1.02 | 1.02 |
| 2 | ITO | 1 | 1 | 1.05 | 1.05 |
|  | ZnO:Ga | 1 | 1 | 1.04 | 1.04 |
| 3 | ITO | 1 | 1 | 1.05 | 1.05 |
|  | ZnO:Ga | 1 | 1 | 1.04 | 10.4 |
| 4 | ITO | 1.02 | 1 | 1.04 | 1.06 |
|  | ZnO:Ga | 1.02 | 1 | 1.04 | 1.06 |
| 5 | ITO | 1 | 1 | 1.05 | 1.05 |
|  | ZnO:Ga | 1 | 1 | 1.04 | 1.04 |
| Com. | ZnO:Al | 1 | 1 | 1 | 1 |

Table 1 shows that the thin-film solar cells including a ZnO layer as formed by a film-formation method according to the present invention exhibit improved output characteristics as compared with the thin-film solar cell including a ZnO layer as formed by the film-formation method of Comparative Example. That is because the method of the present invention forms a good-quality ZnO layer and reduces damage to the semiconductor photovoltaic conversion layer underlying the ZnO layer.

According to the present invention, the rear transparent electrode layer has the two-layer structure of the ITO or ZnO:Ga layer and the ZnO:Al layer formed on the semiconductor photovoltaic conversion layer in this order. With this structure, it is possible to use ITO or ZnO:Ga which has a higher carrier density and a lower specific resistance than ZnO:Al which has usually been used for rear transparent electrodes. Thus improvement can be achieved in the stability of the film quality and the output characteristics of the rear transparent electrode layer of the thin-film solar cell. In particular, the use of the ITO or ZnO:Ga film as a layer in contact with the photovoltaic conversion layer allows good contact with the photovoltaic conversion layer and further improvement in the photovoltaic conversion efficiency.

In the case where the ITO or ZnO:Ga film is 5 to 30 nm thick, in particular, a rise in the production costs can be suppressed in addition to the good contact with the photovoltaic conversion layer.

Further, according to the present invention, the rear transparent electrode layer is formed to have the two-layer structure of the ITO or ZnO:Ga layer and the ZnO:Al layer continuously using a magnetron sputtering apparatus of the substrate-moving type in which the ITO or ZnO:Ga target and the ZnO:Al target are disposed in this order in the substrate-moving direction. Thereby the rear transparent electrode layer with good quality can be formed stably with high throughput. Thus it is possible to manufacture thin-film solar cells with remarkably improved output characteristics, especially the fill factor, at reduced production costs.

As is often the case with conventional methods, owing to the change with time of the target that powdery contaminants gradually adhere to the surface of the target, excess oxygen atoms and the powdery contaminants are released at the initial stage of discharge. According to the present invention, however, since the rear transparent electrode layer is formed by the substrate-moving-type apparatus, it is possible to prevent excess oxygen atoms and powdery contaminants coming out of the surface of the target at a quite initial stage of starting sputtering from contacting or adhering to the substrate. Thereby, it is possible to avoid damage to the photovoltaic conversion layer which might be caused by contact of the photovoltaic conversion layer to the excess oxygen atoms as well as to obtain a homogeneous rear transparent electrode layer having a good quality. Thus the output characteristics of the thin-film solar cell can be improved.

In the case where the ITO or ZnO:Ga target has a relative density of 95% or higher, especially, it is possible to prevent the change with time, i.e., powdery contaminants gradually accumulate on the surface of the target. That leads to a still better contact between the photovoltaic conversion layer and the rear transparent electrode layer and an improved fill factor FF as a solar cell characteristic.

In the case where the ITO and ZnO:Ga target has a tin content of 2 to 15 wt % and a Ga content of 2 to 7 wt %, respectively, the rear transparent electrode layer can have a sufficient conductivity and can also have a better contact with the photovoltaic conversion layer. That improves the fill factor FF. Moreover, a short circuit current, which is a solar cell characteristic, can be increased while a sufficient light-transmissivity can be maintained.

In the case where the magnetic field intensity of the ITO or ZnO:Ga target is set higher than that of the ZnO:Al target and/or in the case where the magnetic field intensity of the ITO or ZnO:Ga target is set 900 G or higher, the plasma impedance on the ITO or ZnO:Ga target can be reduced to decrease the discharge voltage at the same discharge power. Thereby it is possible to suppress the damage to the photovoltaic conversion layer caused by residual oxygen on the surface of the target and to obtain a better contact with the photovoltaic conversion layer. Also since the magnetic field density of the ZnO:Al target is low, the costs for magnets can be reduced. It is technically difficult to establish a high magnetic field, for example, of 1000 G or more uniformly over the surface of the ZnO:Al target with a large area. Consequently, that raises the production costs.

In the case where the ITO or ZnO:Ga layer is formed at a lower power than that at which the ZnO:Al layer is formed and/or in the case where the ITO or ZnO:Ga layer is formed at a discharge density of 1 to 3 W/cm$^2$, it is possible to suppress the damage to the photovoltaic layer caused by residual oxygen on the surface of the target and also to ensure a film thickness distribution in a suitable range. Thus the electric and solar cell characteristics can be improved.

In the case where the ITO or ZnO:Ga layer and the ZnO:Al layer are formed by RF sputtering and by DC sputtering, respectively, the damage to the photovoltaic conversion layer can be suppressed (by RF sputtering) and a high throughput can be obtained (by DC sputtering).

In the case where the state of vacuum is such that the pressure is $5 \times 10^{-3}$ Pa or lower before the formation of the ITO or ZnO:Ga layer, the electric and optical characteristics of the rear transparent electrode layer can be improved and also a high throughput can be obtained.

In the case where only Ar is introduced without introducing oxygen when the ITO or ZnO:Ga layer is formed, the electric and solar cell characteristics can be improved without complicating the control of the manufacture process.

What is claimed is:

1. A thin-film solar cell comprising:
   a transparent electrode layer;
   a semiconductor photovoltaic conversion layer;
   a rear transparent electrode layer; and
   a rear reflective metal layer, said layers being formed in this order on a transparent substrate,
   wherein the rear transparent electrode has a two-layer structure of a ZnO:Ga layer and a ZnO:Al layer formed in this order on the semiconductor photovoltaic conversion layer.

2. A thin-film solar cell according to claim 1, wherein the ZnO:Ga layer is 5 to 30 nm thick.

3. A thin-film solar cell according to claim 2, wherein the ZnO:Al layer is 50 to 100 nm thick.

4. A thin-film solar cell according to claim 1, wherein a Ga content in the ZnO:Ga layer is 2 to 7 wt %.

5. A method for manufacturing a thin-film solar cell comprising forming a transparent electrode layer, a semiconductor photovoltaic conversion layer, a rear transparent electrode layer and a rear reflective metal layer in this order on a transparent substrate,
   wherein the rear transparent electrode layer is formed in a two-layer structure of a ZnO:Ga layer and a ZnO:Al layer which are continuously formed using a substrate-moving, magnetron sputtering apparatus having ZnO:Ga target and a ZnO:Al target arranged in this order in a substrate-moving direction, so that the ZnO:Ga layer and the ZnO:Al layer of the two layer structure are sequentially formed one after the other in the sputtering apparatus with no additional processing being performed therebetween.

6. A method according to claim 5, wherein the ZnO:Ga target has a relative density of 95% or more.

7. A method according to claim 5, wherein a Ga content in the ZnO:Ga target is 2 to 7 wt %.

8. A method according to claim 5, wherein a magnetic field intensity of the ZnO:Ga target is larger than that of the ZnO:Al target.

9. A method according to claim 8, wherein the magnetic field intensity of the ZnO:Ga target is 900 G or more.

10. A method according to claim 5, wherein the ZnO:Ga layer is formed at a lower sputtering power than that at which the ZnO:Al layer is formed.

11. A method according to claim 5, wherein the ZnO:Ga layer is formed by an RF sputtering method and the ZnO:Al layer is formed by a DC sputtering method.

12. A method according to claim 5, wherein the ZnO:Ga layer is formed at a discharge density of 1 to 3 W/cm$^2$.

13. A method according to claim 5, wherein, before the ZnO:Ga layer is formed, a vacuum state is set such that the pressure is $5 \times 10^{-3}$ Pa or lower.

14. A method according to claim 5, wherein the ZnO:Ga layer is formed in an inert gas atmosphere.

15. The method of claim 5, wherein sputtering targets for the ZnO:Ga layer and ZnO:Al layer are in the same sputtering chamber and are sequentially sputtered.

16. A method for manufacturing a thin-film solar cell comprising forming a transparent electrode layer, a semiconductor photovoltaic conversion layer, a rear transparent electrode layer and a rear reflective metal layer in this order on a substrate,
   wherein the rear transparent electrode layer is formed in a two-layer structure of an ITO or ZnO:Ga layer and a ZnO:Al layer which are formed via sputtering using a sputtering apparatus including an ITO or ZnO:Ga target and a ZnO:Al target, and
   wherein at least two of the following steps are performed during said sputtering: (a) a magnetic field intensity of the ITO or ZnO:Ga target is caused to be larger than that of the ZnO:Al target, (b) a magnetic field intensity of the ITO or ZnO:Ga target is 900 G or more, (c) the ITO or ZnO:Ga layer is formed at a lower sputtering power than that at which the ZnO:Al layer is formed, and (d) the ITO or ZnO:Ga layer is formed by an RF sputtering method and the ZnO:Al layer is formed by a DC sputtering method.

17. The method of claim 16, wherein each of (a)–(d) is performed during said sputtering.

* * * * *